United States Patent
Patil

(10) Patent No.: US 6,439,698 B1
(45) Date of Patent: Aug. 27, 2002

(54) DUAL CURABLE ENCAPSULATING MATERIAL

(75) Inventor: Girish Shivaji Patil, Lexington, KY (US)

(73) Assignee: Lexmark International, INC, Lexington, KY (US)

( * ) Notice: Subject to any disclaimer, the term of this patent is extended or adjusted under 35 U.S.C. 154(b) by 0 days.

(21) Appl. No.: 09/483,499

(22) Filed: Jan. 14, 2000

(51) Int. Cl.[7] .................................................. B41J 2/05
(52) U.S. Cl. ........................................... 347/64; 347/56
(58) Field of Search ................................ 347/20, 63–65, 347/45, 86

(56) References Cited

U.S. PATENT DOCUMENTS

| | | | |
|---|---|---|---|
| 3,808,028 A | * | 4/1974 | Lando ........................ 117/47 |
| 4,225,691 A | | 9/1980 | Crivello |
| 4,351,708 A | | 9/1982 | Berner et al. |
| 4,412,048 A | | 10/1983 | Dixon et al. |
| 4,703,338 A | | 10/1987 | Sagami et al. |
| 4,842,800 A | | 6/1989 | Walles et al. |
| 4,999,699 A | | 3/1991 | Christie et al. |
| 5,015,675 A | | 5/1991 | Walles et al. |
| 5,041,847 A | | 8/1991 | Matsumoto et al. |
| 5,068,267 A | | 11/1991 | Uchida et al. |
| 5,095,053 A | | 3/1992 | Walles et al. |
| 5,128,806 A | | 7/1992 | Tomko et al. |
| 5,140,075 A | | 8/1992 | Tomko et al. |
| 5,390,082 A | | 2/1995 | Chase et al. |
| 5,493,320 A | | 2/1996 | Sandbach, Jr. et al. |
| 5,519,421 A | | 5/1996 | Barr et al. |
| 5,736,998 A | * | 4/1998 | Caren et al. .................. 347/45 |
| 5,773,528 A | | 6/1998 | Alvarado et al. |
| 5,863,970 A | | 1/1999 | Ghoshal et al. |
| 6,121,388 A | * | 9/2000 | Umetsu et al. ............. 525/425 |
| 6,187,833 B1 | * | 2/2001 | Oxman et al. ................ 522/15 |
| 6,265,509 B1 | * | 7/2001 | Muller ........................ 526/266 |

* cited by examiner

*Primary Examiner*—John Barlow
*Assistant Examiner*—An H. Do
(74) *Attorney, Agent, or Firm*—David E. LaRose

(57) ABSTRACT

A dual curable encapsulant is provided for use in protecting electrical components. The encapsulant contains from about 0 to about 20 percent by weight of a multifunctional epoxy material, from about 80 to about 95 percent by weight of a difunctional epoxy material, a catalytic amount of a photo-curative catalyst and co-catalyst and a reactive diluent. Ink jet printer parts assembled and protected with the dual curable encapsulant exhibit enhanced ink corrosion protection.

26 Claims, 2 Drawing Sheets

DUAL CURABLE ENCAPSULATING MATERIAL

FIELD OF THE INVENTION

The invention relates to an improved encapsulating material for electronic components, to a method for protecting electronic components of an ink jet printhead and to ink jet printheads constructed using the encapsulating material.

BACKGROUND OF THE INVENTION

Ink jet printers continue to evolve as the technology for ink jet printing continues to improve to provide higher speed, higher quality printers. The improvement in speed and quality does not come without a price, however. The printheads of such printers are more costly to manufacture and thus there is a movement to longer life permanent or semi-permanent printheads which are used in conjunction with replaceable ink cartridges.

With the movement to longer life permanent or semi-permanent printheads, there arises a need for improved methods of protecting the electrical components, particularly the flexible circuit or TAB circuit traces and the electrical connections between the traces and the substrate chips from ink corrosion. If the traces or electrical connections are not adequately protected from the ink, electrical shorts or inadequate electrical signals to the printhead could result.

A variety of ways for protecting the electrical circuits have been attempted. For example, PCT application No. WO 98/55316 filed May 26, 1998, describes the use of a latent curable film for use in bonding a flexible circuit to a pen body of an ink jet printer pen. The film is said to contain an epoxy material, a polyester component, a photoinitiator and a hydroxyl-containing material. According to the '316 application, curing of the bonding film is initiated by exposing the film to ultraviolet radiation and the film then continues to cure at room temperature without further exposure to radiation. The amount of epoxy-containing material relative to the amount of the polyester component in the film is said to be selected depending on the properties such as film strength or film flexibility which are desired. Such bonding films therefore have a shelf-life once curing is initiated by the ultraviolet radiation which may not be adaptable to changes in manufacturing steps or procedures.

Despite advances made in the art of bonding electrical circuits to the pen bodies, there remains a need for improved formulations which provide enhanced protection of electrical components and greater flexibility with regard to manufacturing processes. Also as ink formulations also continue to improve, there is a need for more robust encapsulating materials which better withstand the corrosive properties of the improved ink formulations.

SUMMARY OF THE INVENTION

With regard to the foregoing and other object and advantages, the invention provides a dual curable encapsulant which includes from about 0 to about 20 percent by weight of a multifunctional epoxy material, from about 80 to about 95 percent by weight of a di-functional epoxy material, a catalytic amount of a photoinitiator and co-catalyst and a reactive diluent.

In another aspect the invention provides a method for protecting electrical traces on a flexible circuit or TAB circuit and connections between the traces and one or more printheads for an ink jet printer. The method includes applying a dual curable encapsulant to the flexible circuit or TAB circuit connections wherein the encapsulant contains from about 0 to about 20 percent by weight of a multifunctional epoxy material, from about 80 to about 95 percent by weight of a difunctional epoxy material, a catalytic amount of a photoinitiator and co-catalyst and a reactive diluent. After applying the encapsulant to the connections, at least a portion of the encapsulant is exposed to actinic radiation sufficient to initiate cross-linking between the difunctional and multifunctional epoxy materials and to cure at least portions of the encapsulant material exposed to actinic radiation. Heat is then applied to the encapsulant material at a temperture sufficient to cure any portion of the encapsulant material not exposed to the actinic radiation.

In yet another aspect the invention provides a pen for an ink jet printer. The pen includes a cartridge body containing one or more printheads attached thereto and one or more flexible circuits or TAB circuits attached to the one or more printheads. Each of the flexible circuits or TAB circuits contains electrical traces and electrical connections from the traces to the one or more printheads. An encapsulant encapsulates the connections, the encapsulant containing from about 0 to about 20 percent by weight of a multifunctional epoxy material, from about 80 to about 95 percent by weight of a di-functional epoxy material, a catalytic amount of a photoinitiator, a co-catalyst and a reactive diluent.

An advantage of the compositions and methods according to the invention is that ink jet pens may be assembled and critical electrical connections protected with an encapsulant that may be cured by actinic radiation or thermal energy alone or by a combination of actinic radiation and thermal energy. This is particularly useful for protecting parts which, when assembled are shielded or hidden from radiation sources which are used for curing such as when the encapsulant to be cured is disposed on the back side of the flexible circuit or TAB circuit between the circuit and the cartridge body. Another advantage of the invention is that it provides an encapsulant which may be cured an amount sufficient to enable handling of critical electrical parts during assembling of the printer components without loss or flow of encapsulant away from the desired location.

While not desiring to be limited by theory, it is believed the co-catalyst transforms or otherwise interacts with the photoinitiator to provide a unique initiator which enables the encapsulant to be cured by either actinic radiation or thermal energy.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein.

DETAILED DESCRIPTION OF THE INVENTION

Figure 1:
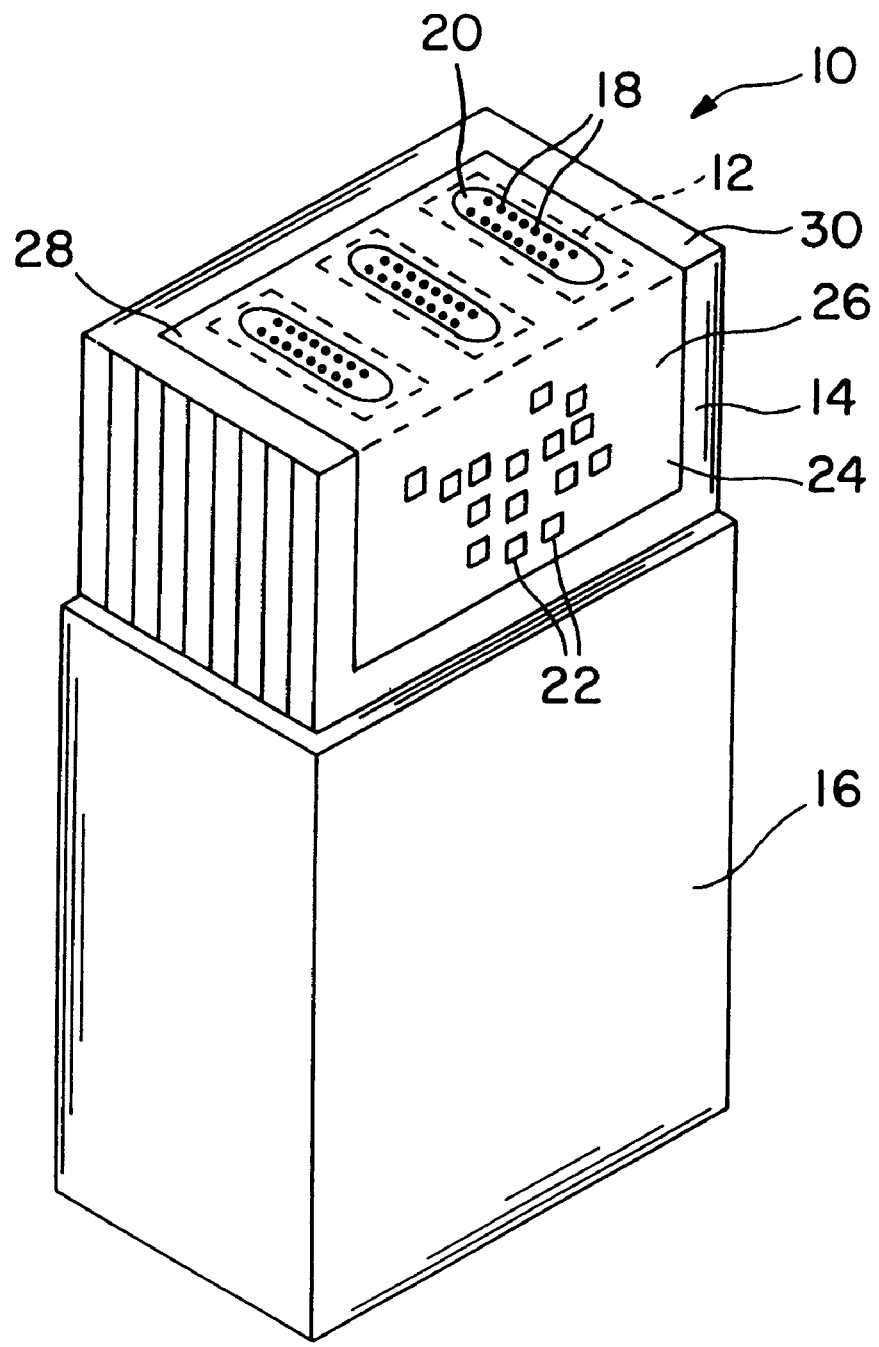
FIG. 1 is a perspective view of an ink jet pen according to the invention.

With reference to FIG. 1, there is shown, in perspective view, an ink jet pen 10 including one or more printheads 12 attached to a cartridge body 14. A replaceable ink cartrdge 16 containing one or more inks is removably attached to the cartridge body for feeding ink to the one or more printheads 12 for ejection of ink toward a print media from nozzle holes 18 on nozzle plates 20. Each ink jet pen 10 may contain a single color ink, such as black, cyan, magenta or yellow or may contain multiple colors of ink. In the illustration shown in FIG. 1, the ink jet pen 10 contains three printheads 12 for ejecting three different colors of ink.

In order to control the ejection of ink from the nozzle holes 18, each of the printheads 12 is electrically connected to a print controller in the printer to which the pen 10 is attached. Connections between the print controller and the pen are provided by contact pads 22 which are disposed on a first portion 24 of a flexible circuit or tape automated bonding (TAB) circuit 26. Flexible circuits and TAB circuits are resilient polymeric films such as polyimide films 26 which contain electrical traces thereon for conducting electrical signals from a source to a device connected to the traces of the flexible or TAB circuit 26. Accordingly, a second portion 28 of the flexible circuit or TAB circuit 26 is disposed on the operative side 30 of the cartridge body 14. The reverse side of the flexible circuit or TAB circuit 26 typically contains electrical traces which provide electrical continuity between the contact pads 22 and the printheads 12 for controlling the ejection of ink from the printheads. Electrical TAB bond or wire bond connections are made between the eletrical traces and the individual printheads as described in more detail below.

Figure 2:
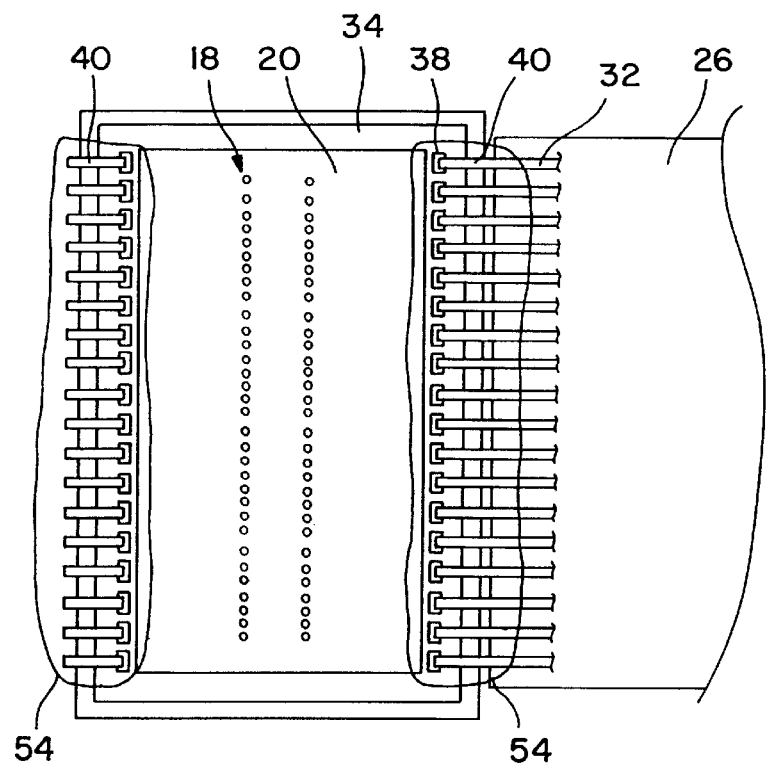
FIG. 2 is a plan view of a portion of an ink jet pen containing an encapsulant material according to the invention.
Figure 3:
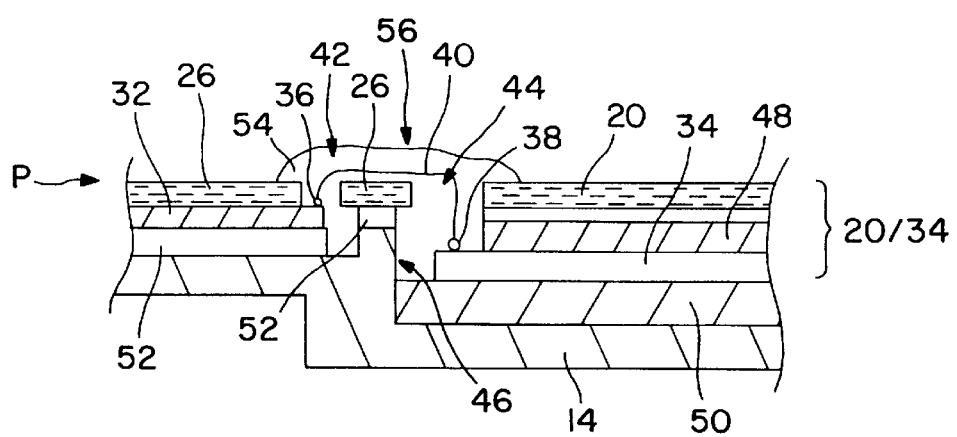
FIG. 3 is a cross-sectional side view of a portion of an ink jet pen according to the invention.

Connections between the flexible circuits or TAB circuits and the printheads are shown in detail by reference to FIGS. 2 and 3. As described above, the flexible or TAB circuits 26 contain electrical traces 32 which are electrically connected to a semiconductor chip 34. The chip 34 contains resistors and/or other electronic devices such as piezoelectric devices for inducing ejection of ink through nozzle holes 18 of a nozzle plate 20 toward a print media. Connection pads 36 on the flexible or TAB circuits 26 are connected to bond pads 38 on the semiconductor chip 34 either by TAB bonding techniques or by use of wires 40 using a wire bonding procedure through windows 42 and 44.

As shown in FIG. 3, the semiconductor chip 34 is attached to the cartridge body 14, preferably in a chip pocket 46. Prior to attaching the chip 34 to the cartridge body 14, a nozzle plate 20 is adhesively attached to the chip 34 using adhesive 48. The assembly provided by the nozzle plate 20 attached to the chip 34 is referred to herein as the chip/nozzle plate assembly 20/34 (FIG. 3).

The adhesive 48 may be a heat curable adhesive such a B-stageable thermal cure resin, including, but not limited to phenolic resins, resorcinol resins, epoxy resins, ethyleneurea resins, furane, resins, polyurethane resins and silicone resins. The adhesive 48 is preferably cured before attaching the chip 34 to the cartridge body and the adhesive 48 preferably has a thickness ranging from about 1 to about 25 microns.

After bonding the nozzle plate 20 and chip 34 together, the chip/nozzle plate assembly 20/34 is attached to the cartridge body 14 in chip pocket 46 using a die bond adhesive 50. The die bond adhesive 50 is preferably an epoxy adhesive such as a die bond adhesive available from Emerson & Cuming of Monroe Township, N.J. under the trade name ECCOBOND 3193-17. In the case of a thermally conductive cartridge body 14, the die bond adhesive 50 is preferably a resin filled with thermal conductivity enhancers such as silver or boron nitride. A preferred thermally conductive die bond adhesive 50 is POLY-SOLDER LT available from Alpha Metals of Cranston, Rhode Island. A die bond adhesive 50 containing boron nitride fillers is available from Bryte Technologies of San Jose, Calif. under the trade designation G0063. The thickness of adhesive 50 preferably ranges from about 25 microns to about 125 microns.

Once the chip/nozzle plate assembly 20/34 is attached to the cartridge body 14, the flexible circuit or TAB circuit 26 is attached to the cartridge body 14 using a heat activated or pressure sensitive adhesive 52. Preferred adhesives 52 include, but are not limited to phenolic butyral adhesives, acrylic based pressure sensitive adhesives such as AEROSET 1848 available from Ashland Chemicals of Ashland, Ky. and phenolic blend adhesives such as SCOTCH WELD 583 available from 3M Corporation of St. Paul, Minn. The adhesive preferably has a thickness ranging from about 25 to about 200 microns.

In order to protect the bond pads 38 and wires or TAB bonds 40 from ink corrosion, a protective overcoat layer or encapsulant 54 is applied to the connections 40 and bond pads 38, preferably as a bead 56. The encapsulant 54 is preferably a dual curable encapsulant material. The term "dual curable" means that curing may be conducted by exposure to actinic radiation or thermal energy or by a combination of actinic radiation and thermal energy.

A preferred encapsulant includes a mixture of a multifunctional epoxy material and a difunctional epoxy material. In addition to the epoxy materials, the mixture also preferably contains a photoinitiator, a co-catalyst and a reactive diluent.

The multifunctional epoxy material may be selected from aromatic epoxides such as glycidyl ethers of di- and polyphenols. A particularly preferred multifunctional epoxy resin is a polyglycidyl ether of phenolformaldeyhyde novolak resin such as the novolak epoxy resin having an epoxide equivalent weight ranging from about 172 to about 179 and a viscosity at 25° C. ranging from about 3,000 to about 5,000 centipoise which is available from Dow Chemical Company of Midland, Mich. under the trade name D.E.N. 431. The amount of multifunctional epoxy resin in the formulation preferably ranges from about 0 to about 25 percent by weight of the formulation, most preferably from about 5 to about 20 percent by weight of the total formulation weight.

The difunctional epoxy material component of the formulation is preferably selected from difunctional epoxy compounds which include diglycidyl ethers of bisphenol-A (e.g. those available under the trade designations "EPON 828", "EPON 1004", "EPON 1001F", "EPON SU-8" and "EPON 1010", available from Shell Chemical Company of Houston, Tex., "DER-331", "DER-332", and "DER-334", available from Dow Chemical Company of Midland, Mich., 3,4-epoxycyclohexylmethyl-3,4-epoxycyclohexene carboxylate (e.g. "ERL-4221" available from Union Carbide Corporation of Danbury, Conn., 3,4-epoxy-6-methylcyclohexylmethyl-3,4-epoxy-6-methylcyclohexene carboxylate (e.g. "ERL-4201" available from Union Carbide Corporation), bis(3,4-epoxy-6-methylcyclohexylmethyl) adipate (e.g. "ERL-4289" available from Union Carbide Corporation), and bis(2,3-epoxycyclopentyl)ether (e.g. "ERL-0400" available from Union Carbide Corporation.

A particularly preferred difunctional epoxy resin is a bisphenol-A/epichlorohydrin epoxy resin available from Shell Chemical Company of Houston, Tex. under the trade name EPON resin 828. The amount of difunctional epoxy resin in the formulation preferably ranges from about 75 to about 99 percent by weight of the formulation, most preferably from about 80 to about 95 percent by weight of the formulation.

The encapsulant formulation preferably also contains a photoinitiator, a co-catalyst and a reactive diluent. The photoinitiator is preferably a compound or mixture of compounds capable of generating a cation such as an aromatic complex salt which may be selected from onium salts of a Group VA element, onium salts of a Group VIA element, and aromatic halonium salts. These complex salts, upon being exposed to ultraviolet radiation or electron beam irradiation, are capable of generating moieties which initiate reactions with epoxides. The aromatic complex salt is preferably present in the encapsulant composition in a catalytic amount ranging from about 0.1 to about 5 weight percent, preferably from about 0.5 to about 2 weight percent, based on the total weight of the encapsulant composition.

Preferred aromatic complex salts include aromatic iodonium complex salts and aromatic sulfonium complex salts. Examples of the aromatic iodonium complex salt include:
diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluoroborate
di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzoethienyl)iodonium hexafluorophosphate Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluble in inert organic solvents than are other aromatic iodonium salts of complex ions.

Examples of aromatic sulfonium complex salt aromatic complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyidiphenylsulfonium hexafluoroantimonate
tris(4-phenoxyphenyl)sulfonium hexafluorophosphate
di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynapththyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyidiphenylsulfonium tetrafluoroborate
methyl(n-methylphenothiazinyl)sulfonium hexafluoroantimonate
phenylmethylbenzylsulfonium hexafluorophosphate Of the aromatic sulfonium complex salts which are suitable for use in the compositions of the invention the preferred salts are the triaryl-substituted salts such as triphenylsulfonium hexafluorophosphate. The triaryl-substituted salts are preferred because they are more thermally stable than the mono- and diaryl substituted salts thereby providing a one-part system with long shelf life. The triaryl-substituted complex salts are also more amenable to dye sensitization. Consequently, the use of such complex salts results in compositions which are much more useful in applications where near ultraviolet and visible light are used for exposure.

The co-catalyst is preferably a combination of a metal catalyst and an α-hydroxy compound. The preferred metal catalyst is a transition metal salt such as Cu(I) bromine, Cu(I) chloride, or a complex selected from carboxylic acid and mineral acid copper salts such as Cu(II) benzoate, Cu(II) citrate, Cu(II) formate, Cu(II) acetate, Cu(II)stearate, Cu(II) oleate, Cu(II) carbonate, Cu(II) gluconate and the like. A particularly preferred metal catalyst is cupric benzoate. The amount of metal catalyst in the formulation preferably ranges from about 0.05 to about 1 percent by weight of the total weight of the formulation.

An α-hydroxy compound is also preferably included as a co-catalyst in the epoxy resin formulation. Preferred α-hydroxy compounds include acyloin, benzoin. and benzpinacol (1,2-dihydroxy-1,1,2,2-tetraphenylethane. Of the foregoing, the most preferred α-hydroxy compound is 2-hydroxy-1,2-diphenylethanone (benzoin). The α-hydroxy compound is preferably present in the composition in an amount ranging from about 0.1 to about 1 percent by weight of the total weight of the formulation. A particularly preferred amount of α-hydroxy compound in the formulation ranges from about 0.3 to about 0.8 percent by weight.

When the photoinitiator and catalyst and co-catalyst are used in combination the epoxy resin formulation may be cured completely either by thermal energy or actinic radiation. Because of the unique photoinitiator/co-catalyst combination, sufficient ionic species are generated in the formulation by the combination of photoinitiator and co-catalyst such that curing of the encapsulant material may be conducted by either a thermal source of energy or by actinic radiation or by a combination of both thermal energy and actinic radiation.

In a preferred embodiment, the resin composition further comprises a reactive diluent or film enhancing agent such as a silane having a functional group capable of reacting with at least one epoxy component of the formulation. Such a silane is preferably contains an epoxide functional group such as a glycidoxyalkyltrialkoxy-silane, more specficially gamma-glycidoxypropyltrimethoxysilane. The silane is preferably present in an amount ranging from about 0.5 to about 5 weight percent of the formulation and preferably from about 1 to about 3.0 weight percent based on total weight of the formulation, including all ranges subsumed therein.

It is preferred that the bead 56 of encapsulant 54 applied in windows 42 and 44 not extend too far above plane P defined by the surface of the nozzle plate 20 and flexible or TAB circuit 26 (FIG. 3). Accordingly, the maximum height of bead 56 above plane P preferably ranges from about 5 to about 10 mils.

After applying the encapsulant 54 to the exposed areas of the electrical traces and bond connections, preferably as bead 56, the encapsulant is exposed to actinic radiation to cure portions of the encapsulant 54 which are not shielded or hidden from the radiation source. Suitable actinic radiation includes visible light, ultraviolet light, electron beam, x-ray, gamma-ray, beta-ray and the like. A preferred actinic radiation for curing the encapsulant 54 is UV radiation having a wavelength in the range of from about 200 to about 400 nanometers. The encapsulant is preferably exposed to ultraviolet radiation for a period of time ranging from about 1 to about 20 seconds.

Before, after or during the curing of adhesives 50 and 52, the ink jet pen 10 is preferably exposed to a thermal heating cycle sufficient to cure any portion of the encapsulant material 54 which was not previously exposed to the actinic radiation source. It is preferred to heat the encapsulant material generally at the same time various of the other adhesives are cured such as the adhesive 50 used to attach the nozzle plate/chip assembly 20/34 to the cartridge body 14 or when curing the adhesive 52 used to attach the flexible circuit or TAB circuit 26 to the cartridge body 14. During the thermal curing cycle, the encapsulant is preferably exposed to a temperature in excess of about 80° C., most preferably a temperature in the range of from about 80 to about 120° C. for a period of time ranging from about 15 minutes to about 2 hours.

The encapsulant 54 preferably has a viscosity which enables placement of the encapsulant 54 on the connections in windows 42 and 44 such that it effectively coats the TAB connections or wires 40 and encapsulates and overlaps the ends of the nozzle plate 20 and flexible circuit or TAB circuit 26. If the viscosity of the encapsulant 54 is too high, void spaces may occur in windows 42 and 44 so that the connections and ends are not effectively protected from ink corrosion. If the encapsulant 54 has too low a viscosity, it will be difficult to provide the bead 56 of encapsulant 54 which will remain in the desired location until curing of the encapsulant 54 is initiated. Accordingly, the viscosity of the encapsulant 54 preferably ranges from about 2,000 to about 25,000 centipoise.

By use of an encapsulant as described above, complete cure of the encapsulant may be achieved even in areas inaccessible to actinic radiation. Accordingly, the formulation and methods described above provide enhanced protection of critical electrical components of ink jet printheads so that the printheads may exhibit longer life in permanent or semi-permanent ink jet pens. The formulations according to the invention also provide enhanced protection against corrosion from inks used in ink jet printer applications.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A dual curable encapsulant which comprises from about 0 to about 20 percent by weight of a multifunctional epoxy material, from about 80 to about 95 percent by weight of a difunctional epoxy material, a catalytic amount of a photoinitiator and co-catalyst, the co-catalyst containing a metal catalyst and an α-hydroxy compound, and a reactive diluent, whereby the encapsulant may be cured by actinic radiation, thermal energy or by a combination of actinic radiation and thermal energy and wherein the metal catalyst is selected from the group consisting of transition metal halides and organic metal complexes.

2. The dual curable encapsulant of claim 1 wherein the multifunctional epoxy material comprises a polyglycidyl ether of phenol-formaldehyde novolak resin.

3. The dual curable encapsulant of claim 1 wherein the difunctional epoxy material comprises a bisphenol-A/epichlorohydrin epoxy resin.

4. The dual curable encapsulant of claim 1 wherein the reactive diluent comprises a silane adhesion promoter.

5. The dual curable encapsulant of claim 4 wherein the reactive diluent comprises 3-glycidoxypropyltrimethoxysilane.

6. The dual curable encapsulant of claim 1 wherein the photoinitiator comprises a compound selected from the group consisting of aromatic iodonium complex salts, aromatic sulfonium complex salts, and combinations thereof.

7. The dual curable encapsulant of claim 6 wherein the photoinitiator comprises diaryliodonium hexafluoroantimonate.

8. The dual curable encapsulant of claim 1 wherein the metal catalyst comprises cupric benzoate.

9. The dual curable encapsulant of claim 1 wherein the α-hydroxy compound comprises 2-hydroxy-1,2-diphenylethanone.

10. A method for protecting electrical traces on a flexible circuit or TAB circuit and connections between the traces and one or more printheads for an ink jet printer, the method comprising applying a dual curable encapsulant to the flexible circuit or TAB circuit connections, the encapsulant containing from about 0 to about 20 percent by weight of a multifunctional epoxy material, from about 80 to about 95 percent by weight of a difunctional epoxy material, a catalytic amount of a photoinitiator and co-catalyst, the co-catalyst containing a metal catalyst and an α-hydroxy compound, and a reactive diluent, whereby the encapsulant may be cured by actinic radiation, thermal energy or by a combination of actinic radiation and thermal energy and wherein the metal catalyst is selected from the group consisting of transition metal halides and organic metal complexes, exposing at least a portion of the encapsulant to actinic radiation sufficient to initiate cross-linking between the difunctional and multifunctional epoxy materials and to cure at least portions of the encapsulant material exposed to actinic radiation and heating the encapsulant material to a temperature sufficient to cure any portion of the encapsulant material not exposed to the actinic radiation.

11. The method of claim 10 wherein the multifunctional epoxy material comprises a polyglycidyl ether of phenol-formaldehyde novolak resin.

12. The method of claim 10 wherein the difunctional epoxy material comprises a bisphenol-A/epichlorohydrin epoxy resin.

13. The method of claim 10 wherein the reactive diluent comprises 3-glycidoxypropyltrimethoxysilane.

14. The method of claim 10 wherein the photoinitiator comprises a compound selected from the group consisting of aromatic iodonium complex salts, aromatic sulfonium complex salts, and combinations thereof.

15. The method of claim 14 wherein the photoinitiator comprises diaryliodonium hexafluoroantimonate.

16. The method of claim 10 wherein the metal catalyst comprises cupric benzoate.

17. The method of claim 10 wherein the α-hydroxy compound comprises 2-hydroxy-1,2-diphenylethanone.

18. A pen for an ink jet printer which comprises a cartridge body containing one or more printheads attached thereto and one or more flexible circuits or TAB circuits attached to the one or more printheads, the flexible circuits or TAB circuits containing electrical traces and electrical connections from the traces to the one or more printheads and a dual curable encapsulant encapsulating the connections, the encapsulant containing from about 0 to about 20 percent by weight of a multifunctional epoxy material, from about 80 to about 95 percent by weight of a difunctional epoxy material, a catalytic amount of a photoinitiator and co-catalyst, the co-catalyst containing a metal catalyst and an α-hydroxy compound, and a reactive diluent, whereby the encapsulant may be cured by actinic radiation, thermal energy or by a combination of actinic radiation and thermal energy and wherein the metal catalyst is selected from the group consisting of transition metal halides and organic metal complexes.

19. The ink jet printer of claim 18 further comprising an ink cartridge containing ink removably attached to the body.

20. The ink jet printer of claim 18 wherein the multifunctional epoxy material comprises a polyglycidyl ether of phenol-formaldehyde novolak resin.

21. The ink jet printer of claim 18 wherein the difunctional epoxy material comprises a bisphenol-A/epichlorohydrin epoxy resin.

22. The ink jet printer of claim 18 wherein the reactive diluent comprises 3-glycidoxypropyltrimethoxysilane.

23. The ink jet printer of claim 18 wherein the photoinitiator comprises a compound selected from the group consisting of aromatic iodonium complex salts, aromatic sulfonium complex salts, and combinations thereof.

24. The ink jet printer of claim 23 wherein the photoinitiator comprises diaryliodonium hexafluoroantimonate.

25. The ink jet printer of claim 18 wherein the metal catalyst comprises cupric benzoate.

26. The ink jet printer of claim 18 wherein the α-hydroxy compound comprises 2-hydroxy-1,2-diphenylethanone.

* * * * *